(12) United States Patent
Rizzo

(10) Patent No.: US 6,501,144 B1
(45) Date of Patent: Dec. 31, 2002

(54) CONDUCTIVE LINE WITH MULTIPLE TURNS FOR PROGRAMMING A MRAM DEVICE

(75) Inventor: Nicholas D. Rizzo, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/010,812

(22) Filed: Nov. 13, 2001

(51) Int. Cl.[7] .......................... H01L 29/82; H01L 43/00
(52) U.S. Cl. ...................................... 257/421; 257/295
(58) Field of Search ............................... 257/421, 295; 365/158

(56) References Cited

U.S. PATENT DOCUMENTS 6,351,409 B1 * 2/2002 Rizzo et al. ................. 365/158
6,358,756 B1 * 3/2002 Sandhu et al. .............. 438/238
6,388,917 B2 * 5/2002 Hoffmann et al. .......... 365/158

* cited by examiner

*Primary Examiner*—David Nelms
*Assistant Examiner*—Tu-Tu Ho
(74) *Attorney, Agent, or Firm*—William E. Koch

(57) ABSTRACT

A conductive line for programming a magnetoresistive memory element comprising N metal layers separated by an electrically insulator layer, wherein the bit conductive is positioned proximate to a magnetoresistive memory device and flows a current that induces a magnetic field for programming the magnetoresistive memory device. The current needed to induce a given magnetic field is reduced by a factor of N, wherein N is a whole number greater than or equal to two. To further decrease the current, the conductive line is cladded with a ferromagnetic region to increase the magnetic field proximate to the magnetoresistive random access memory device.

24 Claims, 2 Drawing Sheets

CONDUCTIVE LINE WITH MULTIPLE TURNS FOR PROGRAMMING A MRAM DEVICE

FIELD OF THE INVENTION

This invention relates to semiconductor memory devices.

More particularly, the present invention relates to an improved conductive line for supplying currents to semiconductor random access memory devices that utilize a magnetic field.

BACKGROUND OF THE INVENTION

A magnetic memory device has a structure which includes ferromagnetic layers separated by a non-magnetic layer. The ferromagnetic layers have a free magnetic moment vector that can be oriented in one of several preferred directions relative to a pinned magnetic moment vector that is fixed in direction. The orientation of the free magnetic moment vector relative to the pinned magnetic moment vector creates unique resistance states that are used to represent stored information. Accordingly, a detection of changes in resistance allows a magnetic memory device to provide stored information. In typical magnetic memory devices, two resistance states are available. The stored states can be read by passing a sense current through the cell in a sense line because of the difference between the magnetic resistances of the states.

In magnetoresistive random access memory (hereinafter referred to as MRAM) devices, the memory cells are programmed by magnetic fields induced by a single current carrying conductor such as a copper interconnect. Typically, two orthogonal interconnects are employed, with one positioned above (hereinafter referred to as the bit line) the MRAM device and the second positioned below (hereinafter referred to as the digit line) the MRAM device. The purpose of the bit and digit lines is to provide magnetic fields for programming the MRAM device.

However, one of the trends in semiconductor device technology is to scale circuitry to lower power, especially for portable applications, such as laptop computers, cell phones, and pagers. A MRAM device integrates magnetic memory elements and other circuits, for example, a control circuit for magnetic memory elements, comparators for detecting states in a magnetic memory element, input/output circuits, etc. These circuits are usually fabricated in the process of CMOS technology, which operates at low current and high efficiency, in order to lower the power consumption of the MRAM devices.

Thus, it is desirable to fabricate MRAM devices that are more compatible with CMOS technology. However, a problem with MRAM devices is that they typically require large programming currents to write information. Large currents are needed to create a large enough magnetic field to cause the free magnetic moment vector to orientate itself in the desired direction.

It would be highly advantageous, therefore, to remedy the foregoing and other deficiencies inherent in the prior art.

Accordingly, it is an object of the present invention to provide a new and improved interconnect for programming a magnetoresistive random access memory device.

It is an object of the present invention to provide a new and improved interconnect which reduces the power consumption of the device.

It is another object of the present invention to provide a new and improved interconnect which makes the magnetoresistive random access memory device more compatible with CMOS technology.

It is a further object of the present invention to provide a new and improved interconnect which allows the magnetoresistive random access memory device to operate at lower current.

It is another object of the present invention to provide a new and improved interconnect which produces a larger magnetic field for a given programming current.

SUMMARY OF THE INVENTION

To achieve the objects and advantages specified above and others, a interconnect for programming a MRAM device is disclosed which includes a metal bit line formed of N metal layers, wherein each N metal layer is separated by an electrically insulating layer, where N is a whole number greater than or equal to two. Further, each N metal layer is connected in series. The purpose of increasing N is to decrease the amount of current needed to induce a given magnetic field for switching the MRAM device. Hence, the current needed to produce a given magnetic field to program the MRAM device is reduced by a factor of N. Thus, the MRAM device can be programmed with less power and, consequently, is more compatible with CMOS technology and portable applications.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
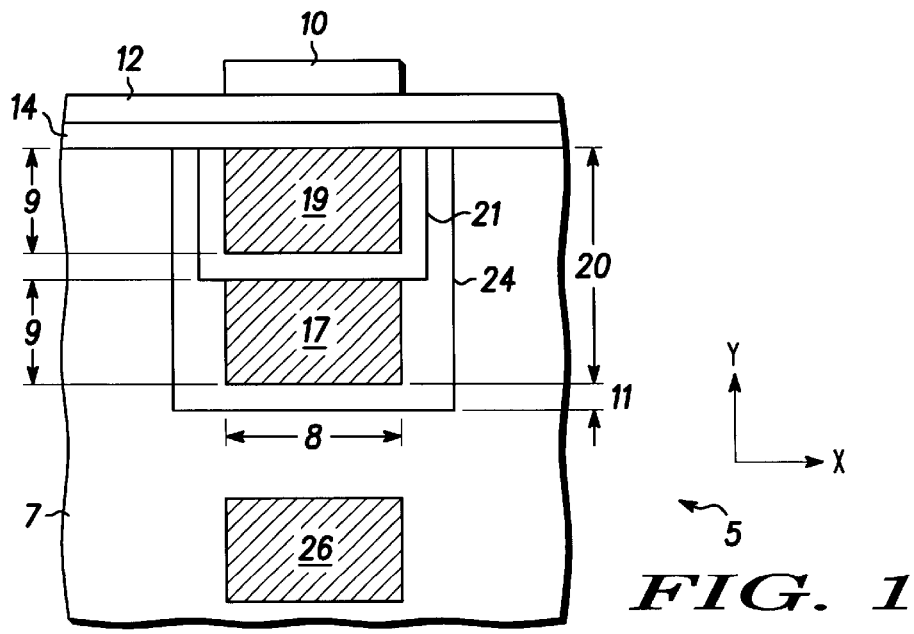
FIG. 1 is a simplified sectional view illustrating an interconnect in accordance with the present invention.

Turn now to FIG. 1, which illustrates a simplified sectional view of an interconnect 5 for programming a MRAM device 10 in accordance with the present invention. Interconnect 5 includes an insulating substrate 7 where a ferromagnetic cladding region 24 which has a thickness 11 is formed. Ferromagnetic cladding region 24 can be formed by etching a trench in insulating substrate 7 by using standard semiconductor patterning and etching techniques. Further, ferromagnetic cladding region layer 24 is optional, but is included in this preferred embodiment for reasons discussed presently. Also, ferromagnetic cladding region 24 is illustrated as a single layer, but it will be understood that ferromagnetic cladding region 24 can include a plurality of layers. For example, it is well known to those skilled in the art that a metal layer/ferromagnetic layer/metal layer can be used as an effective cladding layer, wherein the metal layers can include tantalum and the ferromagnetic layer can include nickel iron (NiFe). However, ferromagnetic cladding region 24 is illustrated as including one layer of a ferromagnetic material in this embodiment for simplicity.

A metal digit line region 20 which has an area and a resistance, is positioned on ferromagnetic cladding region 24, wherein metal digit line region 20 includes a plurality of metal layers 17 and 19 which each have a width 8, a height 9, an area A equal to width 8 multiplied by height 9, and a resistance. Further, metal layers 17 and 19 are each separated by an electrically insulating layer 21. In the preferred embodiment, width 8 of metal layers 17 and 19 and height 9 of metal layers 17 and 19 are chosen to be equal, but it will be understood that this is for illustrative purposes only.

Metal digit line region 20 is formed by using electrochemical deposition or a similar technique. Further, in the preferred embodiment, metal digit line region 20 is formed using a self-aligned process by etching a trench in digit line region 20 using dry or wet etching. However, it will be understood that metal bit line region 20 can be formed using other techniques well known to those skilled in the art.

In general, metal digit line 20 includes N metal layers or turns that are separated by electrically insulating layers, wherein N is a whole number greater than or equal to two. In the preferred embodiment, however, N is chosen to be equal to two for illustrative purposes only. A current return line 26 is formed within insulating substrate 7 and positioned proximate to metal digit line 20. The purpose of current return line 26 is to interconnect metal layer 17 with metal layer 19, as will be discussed in conjunction with FIG. 2. For example, a five-layer stack of a metal layer/electrically insulating layer/metal layer/electrically insulating layer/metal layer could be used, wherein N is equal to three. When N is equal to three, two current return lines would be needed to connect the adjacent metal layers in series.

Also, it will be understood that this is a simplified view that only shows the areas of interest, and in particular metal digit line region 20. Further, in this embodiment, the metal layers are illustrated as being stacked proximate to MRAM device 10, but it will be understood that the metal layers can be positioned in other configurations relative to MRAM device 10 such that the magnetic field induced by metal digit line region 20 is sufficient to program MRAM device 10. Further, it will be understood that a metal bit line could also be formed in a similar manner with semiconductor processing techniques well known to those skilled in the art and positioned proximately above MRAM device 10.

In the preferred embodiment, metal digit line region 20 is positioned proximate to MRAM device 10 by using a dielectric interlayer 14 and a metal contact layer 12, which connects MRAM device 10 to a transistor (not shown), to support MRAM device 10. However, it will be understood that other layer structures could be used to position MRAM device 10 proximate to metal digit line region 20. Metal digit line region 20 is capable of supplying a current to induce a magnetic field for switching MRAM device 10. Further, the magnetic field is focused towards MRAM device 10 by ferromagnetic cladding region 24.

For ease of discussion, a digit line not in physical contact with the magnetic memory bit is discussed in reference to FIG. 1. However, it should be understood that while the drawings illustrate a digit line not in physical contact with the magnetic memory bit, that it is also anticipated by this disclosure to form a digit line that is in physical contact with the magnetic memory bit. Thus, it will be understood that in an alternative embodiment, physical contact is made between MRAM device 10 and a magnetically coupled digit line.

In the preferred embodiment, metal layers 17 and 19 can include copper, but it will be understood that metal layers 17 and 19 can include other metals, such as aluminum, silver, gold, platinum, or another suitable conductive material. Typically, metal layers 17 and 19 are deposited by physical vapor deposition (hereinafter referred to as PVD) or plating or another suitable technique well known to those skilled in the art. In FIG. 1, metal layers 17 and 19 are shown to have the same area, but it will be understood that metal layers 17 and 19 can have different areas to adjust the resistance of metal digit line region 20.

Also, in the preferred embodiment, electrically insulating layer 21 includes silicon oxide, but it will be understood that electrically insulating layer 21 can include silicon nitride, aluminum oxide, or another suitable insulating material to electrically insulate each adjacent metal layer. Also, it will be understood that electrically insulating layer 21 can include multiple insulating layers, but is shown as one layer for illustrative purposes.

In this specific embodiment, MRAM device 10 is a standard MRAM bit formed according to well-known practices in the art. While a standard MRAM bit is illustrated herein for convenience, it will be understood by those skilled in the art that many other types of semiconductor devices could be provided. Also, while a single MRAM bit is illustrated for convenience it should be understood that, for example, a complete array of devices or control/driver circuits around the periphery of an array of magnetic memory bits may be formed.

Figure 2:
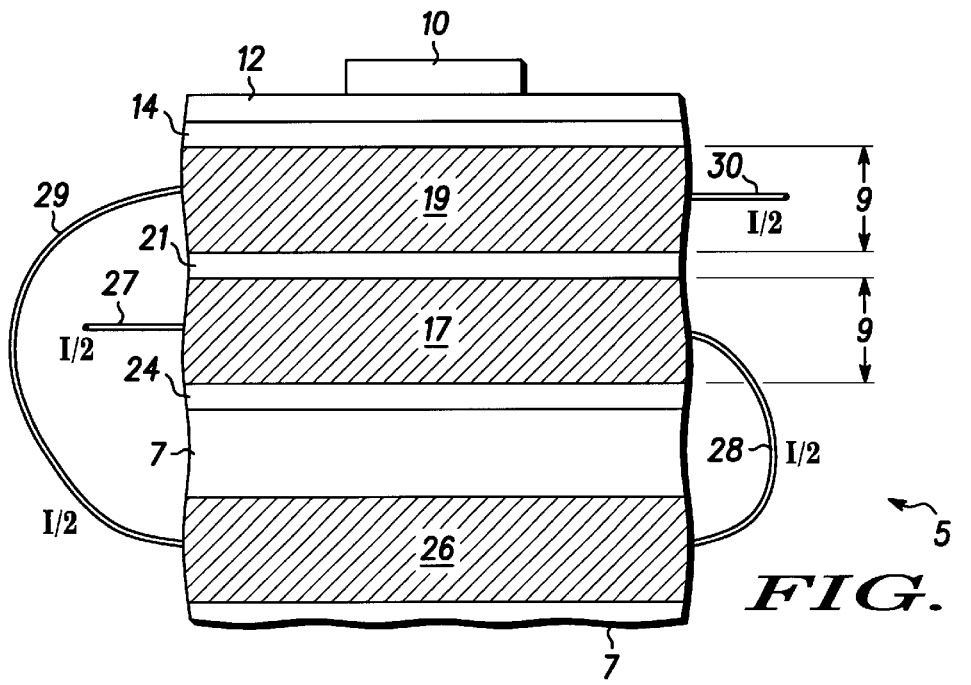
FIG. 2 is a simplified sectional view illustrating the interconnect in FIG. 1 in accordance with the present invention.

The purpose of increasing N is to decrease the amount of current needed to induce a given magnitude of magnetic field for switching MRAM device 10. This is illustrated in FIG. 2 where a side view of interconnect 5 is shown. As mentioned previously, current return line 26 is used to interconnect metal layers 17 and 19, as illustrated. In standard semiconductor integrated circuits, metal layers are typically interconnected by using metal lines and vias. The formation of metal lines and vias to interconnect components included in an integrated circuit is well known to those skilled in the art and will not be elaborated upon here.

In FIG. 2, however, the interconnections are represented schematically as metal wires for simplicity. For example, in FIG. 2, a current is shown to flow in series through metal layer 17, through current return line 26 and then through metal layer 19. Metal layers 17 and 19 and current return line 26 are connected in series by using metal wires 27, 28, 29, and 30, as illustrated. It will be understood that metal wires 27, 28, 29, and 30 can include metal lines, vias, or combinations thereof, but are shown schematically as metal wires for ease of discussion.

Since the same current is flowed in the same direction through both metal layers 17 and 19, the magnetic field produced will be approximately doubled since there are two metal layers. In other words, the current needed to produce a given magnetic field to program MRAM device 10 is reduced by a factor of N. The behavior of metal digit line region 20 is similar to an inductor where the magnetic field increases with the number of turns in the inductor. Thus, metal digit line region can produce more magnetic field for a given current and, consequently, MRAM device 10 can be programmed with less current.

Figure 3:
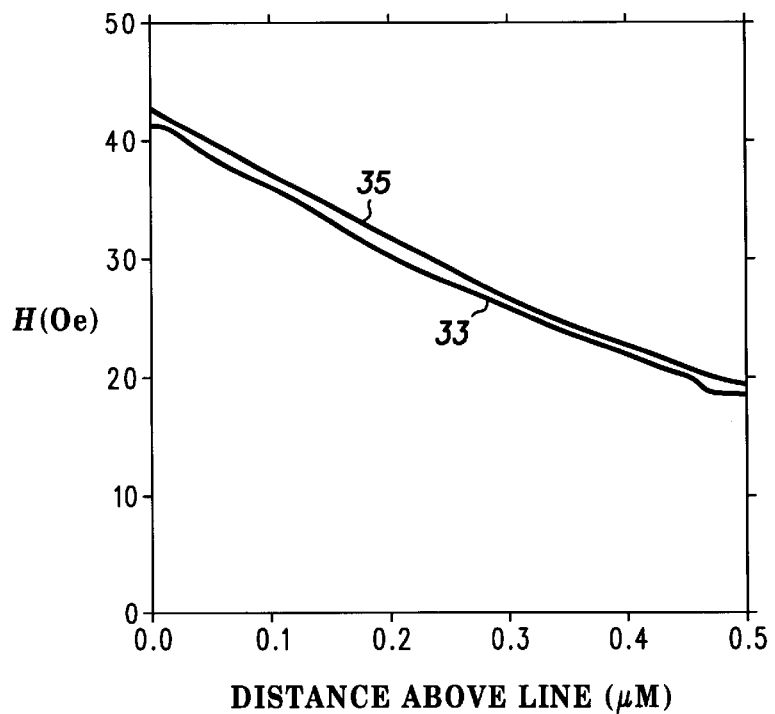
FIG. 3 is a plot illustrating the magnetic field for an interconnect with one turn and a current compared to an interconnect with two turns and half the current.

The effect of the programming current and induced magnetic field is graphically illustrated in FIG. 3, where plot 31 of the magnitude of magnetic field H in the "X" direction is plotted verses the distance above metal digit line region 20 in FIG. 1. The field magnitude is in units of Oersteds. The plot 31 illustrates the magnitude of field over the center of the metal digit line region 20. The data for plot 31 was generated using a magnetostatic numerical solver. For the purposes of generating plot 31, it is assumed that width 8 is equal to 0.9 μm and that height 9 is equal to 0.4 μm. Further, it is assumed that thickness 11 is 25 nm and that ferromagnetic cladding region 24 includes a single layer of NiFe.

In plot 31, curve 33 represents the magnetic field for metal digit line region 20 when N is equal to one and a current I is flowed through it. Curve 35, however, represents the magnetic field for metal digit line region 20 when N is equal to two and a current I/2 is flowed through it. It will be understood that in this simulation, each metal layer when N is equal to two has the same area as the metal layer when N is equal to one so that each metal layer has the same resistance. As illustrated in plot 31, when N is equal to two, metal digit line region 20 induces approximately the same magnetic field as when N is equal to one, only at half the current.

The ferromagnetic cladding region is critical for generating the same magnetic field with current I/N when the area of each multilayer is the same as the area for N equal to one. It is well known in the art that the magnetic field decreases approximately in inverse proportion to distance from a current carrying conductive line. Hence, for an uncladded multilayer digit line with N equal to two, the lower line is generally positioned further away from the MRAM device and will, therefore, generate less magnetic field proximate to the MRAM device when compared to the digit line positioned closer to the MRAM device. This spacing magnetic field loss effect is most evident when the width w of the bit or digit line is comparable to, or less than the distance above the bit or digit lines at which the MRAM device is located. Therefore, an uncladded multilayer with N equal to two and current I/2 will generate less magnetic field than when N is equal to one with current I (This is assuming the area of each metal layer is for N equal to two is equal to the area of the metal layer when N is equal to one). However, the ferromagnetic cladding region eliminates the spacing field loss effect, as the results in FIG. 3 explicitly demonstrate.

With less current generating the same field, MRAM device 10 can be programmed with less current and power. For example, if N is equal to one wherein the single metal layer has an area A, a resistance $R_L$, and carries a current I, then the power consumed is $P=I^2 \cdot R_L$. However, if N is equal to two wherein each metal layer has an area A, then the power consumed is $P=(I/2)^2 \cdot (3 \cdot R_L)=0.75 \cdot I^2 \cdot R_L$, which is 25% less than when N is equal to one. This calculation ignores the power loss from the resistance $R_T$ of the transistor current drivers and switches that are in series with the digit and bit lines. However, when $R_T$ is included, the power is even further reduced for N equal to two compared to the example when N is equal to one. For example, if we assume $R_T \approx R_L$, which is a reasonable assumption since $R_T$ is typically greater than $R_L$, then the power for N equal to two is reduced by a factor of two compared to the power reduction when N is equal to one. It follows that further reductions in power are obtained for N larger than two and for a smaller $R_L$ value.

An additional advantage of having N greater than or equal to two is that a smaller voltage V can be used to produce a given magnetic field. For example, for N equal to one wherein the metal layer has an area A, the voltage to program a current I is given as $V_1=I \cdot (R_L+R_T)$. For N equal to two, however, the voltage is given as $V_2=(I/2) \cdot (3 \cdot R_L+R_T)$, where we have assumed that all the layers have the same area A. The voltage $V_2$ is less than $V_1$ if $R_L<R_T$, which is usually the case. Further, if this example is changed to make N equal to one wherein the metal layer has twice the area (e.g. 2·A), which is the same area as when N is equal to two, then the voltage is less for the N equal to two example if $R_L<2 \cdot R_T$.

A reduction in the voltage required to program a given current is desirable because CMOS technology has limitations on the amount of voltage that can be supplied, such as 3.3 V. Further, it is desirable to make future generations of CMOS with even less supply voltage.

Figures 4, 5:
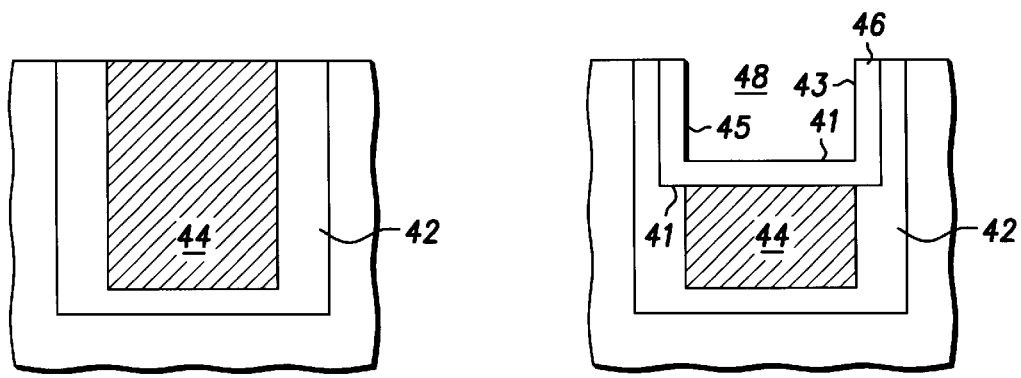
FIGS. 4, 5, and 6 are simplified sectional views illustrating sequential steps in a process of fabricating an interconnect in accordance with the present invention.
Figure 6:
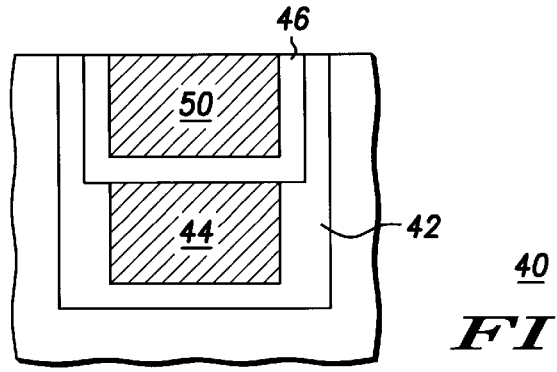

Turn now to FIGS. 4, 5, and 6 which are simplified sectional views illustrating sequential steps in a process of fabricating an interconnect in accordance with the present invention wherein N is equal to two. The sequence of steps in processing the interconnect illustrated in this preferred embodiment are for fabricating a digit line. However, it will be understood that a similar sequence of steps would be used to fabricate a bit line. As illustrated in FIG. 4, a cladded metal interconnect 40 is provided using standard semiconductor processing techniques well known to those skilled in the art. Cladded metal interconnect 40 includes a ferromagnetic region 42 and a metal interconnect 44 wherein metal interconnect 44 includes a first end and a second end. In this embodiment, ferromagnetic region 42 is illustrated as a single layer, but it will be understood that it could include multiple layers. Typically, the ferromagnetic region can be deposited by electroplating (for uniformity control) or another suitable deposition technique well know to those skilled in the art. Electroplating has the advantage of allowing a high aspect ratio when depositing a material in a trench.

A trench 48 is patterned and etched in metal interconnect 44 wherein trench 48 has a bottom 41, a side 43, and a side 45. An electrically insulating region 46 is positioned on bottom 41, side 43, and side 45 of trench 48. A metal interconnect 50 is positioned on electrically insulating region 46 wherein metal interconnect 50 includes a first end and a second end.

A current return line (not shown) is provided proximate to cladded metal interconnect region 40, wherein an electrical contact (not shown) is provided between the second end of first metal interconnect 44 and the second end of the current return line. Further, an electrical contact (not shown) is provided between the first end of the current return line and the first end of metal interconnect 50. The purpose of the current return line is to connect metal interconnect 44 in series with metal interconnect 50. In standard semiconductor integrated circuits, metal interconnects are connected by using metal lines and vias. The formation of metal lines and vias to interconnect components included in an integrated circuit is well known to those skilled in the art and will not be elaborated upon here. A magnetoresistive random access memory device (not shown) is then positioned proximate to cladded metal interconnect region 40.

As discussed previously, the purpose of increasing N is to decrease the amount of current needed to induce a given magnetic field for switching a MRAM device. Since the same current is flowed in the same direction through both metal interconnects 44 and 50, the magnetic field will be approximately doubled since there are two metal interconnects in series. In other words, the current needed to produce a given magnetic field to program a MRAM device is reduced by a factor of N.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A conductive line for programming a magnetoresistive memory device comprising:

an electrically conductive interconnect having a resistance positioned proximate to a magnetoresistive random access memory device, wherein the metal interconnect includes N conductive layers, where N is a whole number greater than or equal to two, wherein each conductive layer is capable of creating a magnetic field and has an area and a resistance and wherein each conductive layer is separated from each adjacent conductive layer by an electrically insulating layer and wherein each conductive layer is connected in series with each adjacent conductive layer such that the net magnetic field produced by the device is proportional to the sum of the magnetic fields for each conductive layer.

2. A conductive line for programming a magnetoresistive memory device as claimed in claim 1 wherein at least one of the N conductive layers includes one of copper, aluminum, silver, gold, platinum, and another suitable conductive material.

3. A conductive line for programming a magnetoresistive memory device as claimed in claim 1 wherein at least one of the electrically insulating layers includes one of silicon oxide, silicon nitride, aluminum oxide, and another suitable insulator material.

4. A conductive line for programming a magnetoresistive memory device as claimed in claim 1 wherein the current required to produce a given magnetic field to program the magnetoresistive random access memory device is reduced by a factor of N.

5. A conductive line for programming a magnetoresistive memory device as claimed in claim 1 wherein the conductive interconnect is cladded with a ferromagnetic cladding region to increase the magnetic field proximate to the magnetoresistive random access memory device.

6. A conductive line for programming a magnetoresistive memory device as claimed in claim 5 wherein the ferromagnetic cladding region includes at least one layer containing Ni, Fe, or Co, combinations thereof, and another suitable ferromagnetic material.

7. A conductive line for programming a magnetoresistive memory device as claimed in claim 5 wherein the ferromagnetic cladding region includes at least one layer of platinum, palladium, ruthenium, rhodium, rhenium, iridium, tantalum, combinations thereof, and another suitable conductive material.

8. A conductive line for programming a magnetoresistive memory device comprising:

a magnetoresistive random access memory device; and a metal interconnect region that produces a magnetic field in the presence of a current flow and has a resistance, the metal interconnect region positioned proximate to the magnetoresistive random access memory device, wherein the metal interconnect region includes N stacked metal layers, where N is a whole number greater than or equal to two, each metal layer having an area and a resistance and wherein each metal layer is separated from each adjacent metal layer by an electrically insulating layer, and wherein the adjacent metal layers are electrically connected in series.

9. A conductive line for programming a magnetoresistive memory device as claimed in claim 8 wherein at least one of the N metal layers includes one of copper, aluminum, silver, gold, platinum, and another suitable conductive material.

10. A conductive line for programming a magnetoresistive memory device as claimed in claim 8 wherein at least one of the electrically insulating layers includes one of silicon oxide, silicon nitride, aluminum oxide, and another suitable insulator material.

11. A conductive line for programming a magnetoresistive memory device as claimed in claim 8 wherein the current flow needed to produce a given magnetic field to program the magnetoresistive random access memory device is reduced by a factor of N.

12. A conductive line for programming a magnetoresistive memory device as claimed in claim 8 wherein the metal interconnect region is cladded with a ferromagnetic cladding region to increase the magnetic field proximate to the magnetoresistive random access memory device.

13. A conductive line for programming a magnetoresistive memory device as claimed in claim 12 wherein the ferromagnetic cladding region includes at least one layer containing Ni, Fe, or Co, combinations thereof, and another suitable ferromagnetic material.

14. A conductive line for programming a magnetoresistive memory device as claimed in claim 12 wherein the ferromagnetic cladding region includes at least one layer of platinum, palladium, ruthenium, rhodium, rhenium, iridium, tantalum, combinations thereof, and another suitable conductive material.

15. A method for fabricating a conductive line for programming a magnetoresistive memory device comprising the steps of:

providing a cladded metal interconnect region including a ferromagnetic cladding region and a first metal interconnect wherein the first metal interconnect includes a first and and a second end;

patterning and etching a trench in the first metal interconnect wherein the trench has a bottom, a first side, and a second side;

providing an electrically insulating region positioned on the bottom, the first side, and the second side of the trench;

providing a second metal interconnect positioned on the electrically insulating region wherein the second metal interconnect includes a first end and a second end;

providing a current return line proximate to the cladded metal interconnect region;

making an electrical contact between the second end of the first metal interconnect and the second end of the current return line;

making an electrical contact between the first end of the current return line and the first end of the second metal interconnect;

making an electrical contact between the first end of the first metal interconnect and an electrical input;

making an electrical contact between the second end of the second metal interconnect and an electrical output; and positioning a magnetoresistive random access memory device proximate to the cladded metal interconnect region.

16. A method of fabricating a conductive line for programming a magnetoresistive memory device as claimed in claim 15 wherein the ferromagnetic cladding region includes at least one layer containing Ni, Fe, or Co, combinations thereof, and another suitable ferromagnetic material.

17. A method of fabricating a conductive line for programming a magnetoresistive memory device as claimed in claim 15 wherein at least a portion of the ferromagnetic cladding region is formed using electrochemical deposition.

18. A method of fabricating a conductive line for programming a magnetoresistive memory device as claimed in claim 15 wherein at least one of the N metal layers includes one of copper and another suitable conductive material.

19. A conductive line for programming a magnetoresistive memory device as claimed in claim 15 wherein the ferromagnetic cladding region includes at least one layer of platinum, palladium, ruthenium, rhodium, rhenium, iridium, tantalum, combinations thereof, and another suitable conductive material.

20. A method of fabricating a conductive line for programming a magnetoresistive memory device comprising the steps of:

providing a magnetoresistive random access memory device;

providing a dielectric layer positioned on the magnetoresistive random access memory device;

patterning and etching a trench with a bottom through the dielectric layer wherein the trench is adjacent to the magnetoresistive memory element;

providing a metal interconnect region positioned on the bottom of the trench and adjacent to the dielectric layer, wherein the metal interconnect region includes N metal layers wherein each metal layer is separated by an electrically insulating layer, where N is a whole number greater than or equal to two, and wherein each metal layer is connected electrically in series with each adjacent metal layer;

removing the dielectric layer adjacent to the metal interconnect region;

depositing an electrically insulating layer on the metal interconnect region; and providing a ferromagnetic cladding region positioned on the electrically insulating layer.

21. A method of fabricating a conductive line for programming a magnetoresistive memory device as claimed in claim 20 wherein the ferromagnetic cladding region includes at least one layer containing Ni, Fe, or Co, combinations thereof, and another suitable ferromagnetic material.

22. A method of fabricating a conductive line for programming a magnetoresistive memory device as claimed in claim 20 wherein at least a portion of the ferromagnetic cladding region is formed using electrochemical deposition.

23. A method of fabricating a conductive line for programming a magnetoresistive memory device as claimed in claim 20 wherein at least one of the N metal layers includes one of copper and another suitable conductive material.

24. A conductive line for programming a magnetoresistive memory device as claimed in claim 20 wherein the ferromagnetic cladding region includes at least one layer of platinum, palladium, ruthenium, rhodium, rhenium, iridium, tantalum, combinations thereof, and another suitable conductive material.

\* \* \* \* \*

UNITED STATES PATENT AND TRADEMARK OFFICE
CERTIFICATE OF CORRECTION

PATENT NO. : 6,501,144 B1
DATED : December 31, 2002
INVENTOR(S) : Rizzo

It is certified that error appears in the above-identified patent and that said Letters Patent is hereby corrected as shown below:

<u>Column 1,</u>
Line 4, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*